(12) United States Patent
Yamamoto et al.

(10) Patent No.: US 12,240,218 B2
(45) Date of Patent: Mar. 4, 2025

(54) BONDED ASSEMBLY, AND CERAMIC CIRCUIT SUBSTRATE AND SEMICONDUCTOR DEVICE USING THE SAME

(71) Applicants: KABUSHIKI KAISHA TOSHIBA, Tokyo (JP); TOSHIBA MATERIALS CO., LTD., Yokohama (JP)

(72) Inventors: Shota Yamamoto, Ota Tokyo (JP); Fumihiko Yoshimura, Yokosuka Kanagawa (JP); Seiichi Suenaga, Yokohama Kanagawa (JP); Tomoyuki Oozeki, Kawasaki Kanagawa (JP)

(73) Assignees: KABUSHIKI KAISHA TOSHIBA, Tokyo (JP); TOSHIBA MATERIALS CO., LTD., Yokohama (JP)

( * ) Notice: Subject to any disclaimer, the term of this patent is extended or adjusted under 35 U.S.C. 154(b) by 0 days.

(21) Appl. No.: 18/115,182

(22) Filed: Feb. 28, 2023

(65) Prior Publication Data

US 2023/0202137 A1 Jun. 29, 2023

Related U.S. Application Data

(63) Continuation of application No. PCT/JP2021/038511, filed on Oct. 19, 2021.

(30) Foreign Application Priority Data

Oct. 20, 2020 (JP) ................................. 2020-175898

(51) Int. Cl.
 *B32B 7/12* (2006.01)
 *B32B 15/04* (2006.01)
 (Continued)

(52) U.S. Cl.
 CPC ................ *B32B 7/12* (2013.01); *B32B 15/04* (2013.01); *B32B 15/20* (2013.01); *C04B 37/023* (2013.01);
 (Continued)

(58) Field of Classification Search
 None
 See application file for complete search history.

(56) References Cited

U.S. PATENT DOCUMENTS 5,807,626 A * 9/1998 Naba ................. B23K 35/3006
                                                       428/673
2009/0283309 A1 * 11/2009 Naba ................. B23K 35/0222
                                                       428/656
(Continued)

FOREIGN PATENT DOCUMENTS

EP      3031789 A1     6/2016
EP      3053899 A1     8/2016
(Continued)

OTHER PUBLICATIONS

International Search Report for corresponding International Application PCT/JP2021/038511 dated Dec. 14, 2021 (2 pages).
(Continued)

*Primary Examiner* — Seth Dumbris
(74) *Attorney, Agent, or Firm* — Harness, Dickey & Pierce, P.L.C.

(57) ABSTRACT

A bonded assembly according to the present embodiment, includes a metal plate and a ceramic substrate bonded to each other through a bonding layer containing Ag. In the bonded assembly, in a measurement region that is formed in a cross section formed by a thickness direction of the bonding layer and an orthogonal direction thereto, and that has a size of a length in the thickness direction of the bonding layer×a length of 200 μm in the orthogonal direc-
(Continued)

tion, a Ag-rich region having a Ag concentration of 60 at % or more has an area ratio of 70% or less to a Ag-poor region having a Ag concentration of 50 at % or less.

10 Claims, 4 Drawing Sheets

(51) Int. Cl.
  *B32B 15/20* (2006.01)
  *C04B 37/02* (2006.01)
  *H01L 23/373* (2006.01)
(52) U.S. Cl.
  CPC ...... *H01L 23/3735* (2013.01); *B32B 2250/40* (2013.01); *B32B 2255/205* (2013.01); *B32B 2307/732* (2013.01); *B32B 2457/08* (2013.01); *C04B 2237/125* (2013.01); *C04B 2237/368* (2013.01); *C04B 2237/407* (2013.01); *C04B 2237/704* (2013.01); *C04B 2237/706* (2013.01); *C04B 2237/708* (2013.01); *C04B 2237/74* (2013.01); *Y10T 428/12458* (2015.01)

(56) References Cited

U.S. PATENT DOCUMENTS

| | | | |
|---|---|---|---|
| 2012/0080216 A1* | 4/2012 | Abe | C22C 9/00 420/587 |
| 2018/0005918 A1 | 1/2018 | Naba et al. | |
| 2020/0013696 A1 | 1/2020 | Naba et al. | |
| 2020/0170118 A1 | 5/2020 | Kato et al. | |

FOREIGN PATENT DOCUMENTS

| | | |
|---|---|---|
| EP | 3492441 A1 | 6/2019 |
| JP | 3302714 B2 | 7/2002 |
| WO | WO-2018/021472 A1 | 2/2018 |

OTHER PUBLICATIONS

European Supplementary Search Report issued Oct. 7, 2024 in corresponding European Patent Application No. 21882795.4.

* cited by examiner

BONDED ASSEMBLY, AND CERAMIC CIRCUIT SUBSTRATE AND SEMICONDUCTOR DEVICE USING THE SAME

CROSS-REFERENCE TO RELATED APPLICATION

This application is a Continuation Application of No. PCT/JP2021/038511, filed on Oct. 19, 2021, and the PCT application is based upon and claims the benefit of priority from Japanese Patent Application No. 2020-175898, filed on Oct. 20, 2020, the entire contents of which are incorporated herein by reference.

FIELD

An embodiment described below mostly relates to a bonded assembly, and a ceramic circuit substrate and a semiconductor device using the same.

BACKGROUND

A ceramic-copper circuit substrate obtained by bonding a ceramic substrate to a copper plate has been used as a circuit substrate on which a semiconductor element and the like are mounted. A ceramic-copper circuit substrate described in International Publication No. WO2017/056360 (Patent Document 1) is one obtained by improving a bonded assembly in which a ceramic substrate and a copper plate are bonded to each other through a bonding layer. In Patent Document 1, a protruded portion of the bonding layer protruded from an end portion of the copper plate is provided. TCT characteristics are improved by controlling the size of this bonding layer protruded portion.

In Patent Document 1, an etching process is employed for controlling the size of the bonding layer protruded portion. The etching process is a process for removing the copper plate and the bonding layer of the bonded assembly. The bonding layer of Patent Document 1 contains Ag, Cu and Ti. A bonding layer containing Ag, Cu and Ti is formed by an active metal bonding method. In the bonded assembly of Patent Document 1, a yield in the control of the size of the protruded portion in the etching process is not always high.

For example, Japanese Patent No. 3302714 (Patent Document 2) describes a conceptual diagram of a bonding layer structure containing Ag, Cu and Ti. In the bonding layer structure of Patent Document 2, Ag, Cu, and Ag—Cu eutectic crystal are present.

A bonding layer formed by the active metal bonding method has a structure where Ag and Cu are present in a mixed manner. In such a mixed structure, a removal effect by an etching solution is varied. This is because the etching effect differs between a portion where the amount of Ag is large and a portion where the amount is small. As a result, the size of the bonding layer protruded portion is varied.

DETAILED DESCRIPTION

Hereinafter, embodiments of a bonded assembly, and a ceramic circuit substrate and a semiconductor device using the same will be described in detail with reference to the drawings.

A bonded assembly according to the present embodiment, includes a metal plate and a ceramic substrate bonded to each other through a bonding layer containing Ag. In the bonded assembly, in a measurement region that is formed in a cross section formed by a thickness direction of the bonding layer and an orthogonal direction thereto, and that has a size of a length in the thickness direction of the bonding layer×a length of 200 µm in the orthogonal direction, a Ag-rich region having a Ag concentration of 60 at % or more has an area ratio of 70% or less to a Ag-poor region having a Ag concentration of 50 at % or less.

A bonded assembly according to an embodiment of the present invention is a bonded assembly comprising a metal plate and a ceramic substrate bonded to each other through a bonding layer containing Ag, wherein, in a measurement region that is formed in a cross section formed by a thickness direction of the bonding layer and an orthogonal direction thereto, and that has a size of a length in the thickness direction of the bonding layer×a length of 200 µm in the orthogonal direction, a Ag-rich region having a Ag concentration of 60 at % or more has an area ratio of 70% or less to a Ag-poor region having a Ag concentration of 50 at % or less.

Figure 1:
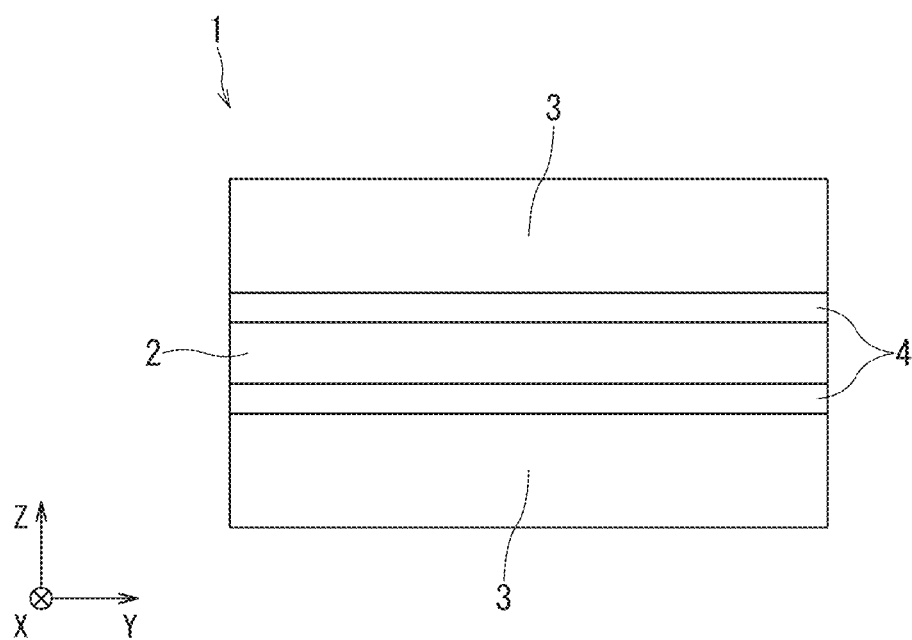
FIG. 1 is a side view illustrating an example of a bonded assembly according to an embodiment.

FIG. 1 illustrates an example of the bonded assembly. In FIG. 1, a reference sign 1 denotes a bonded assembly, a reference sign 2 denotes a ceramic substrate, a reference sign 3 denotes a metal plate, and a reference sign 4 denotes a bonding layer. FIG. 1 illustrates the bonded assembly 1 comprising the metal plates 3 disposed on both surfaces of the ceramic substrate 2 with the bonding layers 4 disposed therebetween. In this exemplified case, the ceramic substrate 2 and the metal plate 3 have the same size. The bonded assembly of the present embodiment is not limited to this configuration, but may employ a structure in which the metal plate is provided on one surface. In FIG. 1, a thickness direction of the ceramic substrate 2, the metal plate 3, and the bonding layer 4 is defined as the Z-axis direction, a longitudinal direction is defined as the X-axis direction, and a lateral direction is defined as the Y-axis direction. The length and the width (the length in the X-axis direction and the length in the Y-axis direction) of the ceramic substrate 2 may be different, and the length and the width of the metal plate 3 may be different.

Examples of the ceramic substrate 2 include a silicon nitride substrate, an aluminum nitride substrate, an aluminum oxide substrate, and an alumina-zirconia substrate. The length in the thickness direction (namely, the Z-axis direction) (hereinafter, simply referred to as the "thickness") of the ceramic substrate 2 is preferably 0.1 mm or more and 1 mm or less. This is because strength may be reduced when the thickness of the ceramic substrate 2 is less than 0.1 mm. On the other hand, when the thickness of the ceramic substrate 2 is larger than 1 mm, the ceramic substrate 2 may become a thermal resistor that deteriorates heat dissipation of the bonded assembly 1.

When the ceramic substrate 2 is a silicon nitride substrate, the silicon nitride substrate preferably has three-point bending strength of 600 MPa or more. Besides, the silicon nitride substrate preferably has thermal conductivity of 80 W/m·K or more. The thickness of the substrate can be reduced when the strength of the silicon nitride substrate is increased. Therefore, the three-point bending strength of the silicon nitride substrate is preferably 600 MPa or more, and more preferably 700 MPa or more. The thickness of the silicon nitride substrate can be reduced to 0.40 mm or less, and further to 0.30 mm or less.

When the ceramic substrate 2 is an aluminum nitride substrate, the three-point bending strength of the aluminum nitride substrate is around 300 to 450 MPa. On the other hand, the thermal conductivity of the aluminum nitride substrate is 160 W/m·K or more. Since the aluminum nitride substrate has low strength, the thickness of the substrate is preferably 0.60 mm or more.

When the ceramic substrate 2 is an aluminum oxide substrate, the three-point bending strength of the aluminum oxide substrate is around 300 to 450 MPa, but this substrate is inexpensive. Alternatively, the ceramic substrate 2 may be an alumina-zirconia substrate. The three-point bending strength of the alumina-zirconia substrate is as high as around 550 MPa, but the thermal conductivity thereof is around 30 to 50 W/m·K. The alumina-zirconia substrate refers to a substrate containing a sintered body of a mixture of aluminum oxide and zirconium oxide.

The ceramic substrate 2 is preferably either one of a silicon nitride substrate and an aluminum nitride substrate. A silicon nitride substrate and an aluminum nitride substrate are nitride ceramic substrates. A nitride ceramic reacts with an active metal brazing material containing Ti to form titanium nitride. Besides, an oxide ceramic reacts with an active metal brazing material containing Ti to form titanium oxide.

The metal plate 3 is preferably one selected from a copper plate, a copper alloy plate, an aluminum plate, and an aluminum alloy plate. Besides, the metal plate 3 is preferably a copper plate or a copper alloy plate. In general, the thermal conductivity of copper is about 400 W/m·K, and the thermal conductivity of aluminum is about 240 W/m·K. Since a copper plate has high thermal conductivity, the heat dissipation of a circuit substrate can be improved. Besides, the thickness of the metal plate 3 can be 0.3 mm or more, and further may be 0.6 mm or more. The heat dissipation of the bonded assembly can be improved by increasing the thickness of the metal plate 3.

The copper plate is preferably an oxygen-free copper plate. Oxygen-free copper is copper having a copper purity of 99.96 mass % [wt %] or more as prescribed in JIS-H-3100.

Here, the cross section is set by a thickness direction of the bonding layer 4 and an orthogonal direction thereto. As a characteristic, in the measurement region formed in this cross section of the bonded assembly 1 and having a size of the thickness of the bonding layer 4×a length of 200 μm in the orthogonal direction, a Ag-rich region having a Ag concentration of 60 at % or more has an area ratio of 70% or less to a Ag-poor region having a Ag concentration of 50 at % or less. It is noted that the thickness direction of the bonding layer 4 corresponds to the Z-axis direction. On the other hand, the orthogonal direction orthogonal to the thickness direction corresponds to a direction that can be obtained in a plane including the X-axis and the Y-axis (namely, the X-Y plane), such as the X-axis direction or the Y-axis direction.

The bonding layer 4 contains Ag (silver), Cu (copper), and Ti (titanium). Ti is an active metal, and easily reacts with the ceramic substrate 2. A bonding method using a brazing material containing Ti is so-called an active metal bonding method. In the active metal bonding method, a Ti reaction layer 5 (illustrated in FIG. 2) is formed on the surface of the ceramic substrate 2. Since the Ti reaction layer 5 is formed, bonding strength is improved. For example, when the ceramic substrate 2 is a nitride-based ceramic substrate, a layer containing titanium nitride (TiN) as a principal component is formed on the surface of the ceramic substrate 2. Alternatively, when the ceramic substrate 2 is an oxide-based ceramic substrate, a layer containing titanium oxide ($TiO_2$) as a principal component is formed thereon. The layer containing titanium nitride or titanium oxide as a principal component thus formed on the surface of the ceramic substrate 2 corresponds to the Ti reaction layer 5.

The bonding layer 4 is provided between the ceramic substrate 2 and the metal plate 3. A boundary between the ceramic substrate 2 and the bonding layer 4 is a boundary between the ceramic substrate 2 and the Ti reaction layer 5 (illustrated in FIG. 2). When nitrogen is detected by EDX area analysis, the layer containing titanium as a principal component is regarded as a Ti nitride. If the boundary between the ceramic substrate 2 and the bonding layer 4 is difficult to discriminate, TEM (transmission electron microscope) analysis is employed. The bonding layer 4 is subjected to EDX point analysis based on a result of TEM analysis, and thus, Ti and N are effectively detected. A similar method can be employed for measuring oxygen.

A boundary between the bonding layer 4 and the metal plate 3 is a farthest portion (portion farthest from the ceramic substrate 2) in a region where a component of the bonding layer 4 is in continuous contact with the metal plate 3 in the measurement region. Besides, the region where the component of the bonding layer 4 being continuous refers to a region where an amount of the component of the bonding layer 4 is 5 at % or more. For example, when the metal plate 3 is a copper plate, a farthest portion in a continuous region having an amount of a Ag component of 5 at % or more corresponds to the boundary between the bonding layer 4 and the metal plate 3.

The amount of Ag in the bonding layer 4 is measured by EDX (energy dispersive X-ray) analysis. The measurement region formed to have a size of the thickness of the bonding layer 4×the length of 200 μm in the orthogonal direction orthogonal to the thickness direction is subjected to EDX analysis to perform area analysis in a unit area using the measurement region as the unit area. It is noted that EDX is sometimes so-called EDS.

In the EDX measurement, SEM-EDX is used. As a SEM, a FE-SEM (field emission SEM) may be used.

As the FE-SEM, JSM-7200F manufactured by JEOL Ltd. or an apparatus having equivalent performance thereto is used. For the EDX, EX-74600U4L2Q manufactured by JEOL Ltd. or an apparatus having equivalent performance thereto is used.

First, area analysis is performed by EDX in the range having a size of the thickness of the bonding layer 4×the length of 200 μm in the orthogonal direction orthogonal to the thickness direction. The range having a size of the thickness of the bonding layer 4×the length of 200 μm in the orthogonal direction orthogonal to the thickness direction is used as the unit area in the area analysis because this is a range suitable for examining the distribution of the component of the bonding layer. In the area analysis by SEM-EDX, mapping function is preferably employed. Color mapping for Ag is employed to select a portion having a high Ag concentration and a portion having a low Ag concentration for concentration analysis. Thus, the area ratio (%) of the Ag-rich region to the Ag-poor region can be measured. Based on the color mapping, an area of 9 μm² or more having a high Ag concentration is selected to analyze the Ag concentration. This concentration can be the Ag concentration in the Ag-rich region. Besides, based on the color mapping, an area of 9 μm² or more having a low Ag concentration is selected to analyze the Ag concentration. This concentration can be the Ag concentration in the Ag-poor region.

As a characteristic of the bonded assembly 1, when a Ag amount in the measurement region of the bonding layer 4 is analyzed, the area ratio of the Ag-rich region to the Ag-poor region (hereinafter, simply referred to as the "area ratio of the Ag-rich region") is 70% or less in the measurement region of the bonding layer 4. In the bonded assembly 1 of the present embodiment, the area ratio of the Ag-rich region is 70% or less no matter which part of the bonding layer 4 is measured. Therefore, the area ratio (%) of the Ag-rich region to the Ag-poor region may be obtained in accordance with a formula, the area ratio (%) of the Ag-rich region to the Ag-poor region=[the area of the Ag-rich region/(the area having a size of the thickness of the bonding layer 4×the length of 200 μm in the orthogonal direction orthogonal to the thickness direction)]×100(%).

Figure 2:
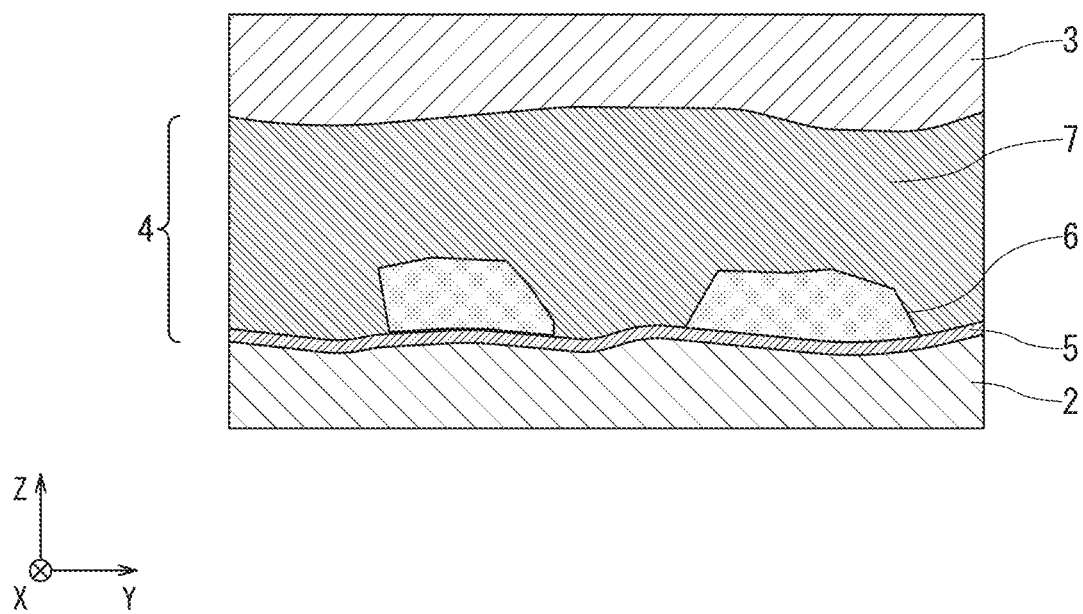
FIG. 2 is a cross-sectional view illustrating an example of Ag-rich regions and a Ag-poor region in a bonding layer.

FIG. 2 schematically illustrates an example of a part of a cross section of the bonded assembly 1. In FIG. 2, a reference sign 2 denotes a ceramic substrate, a reference sign 3 denotes a metal plate, a reference sign 4 denotes a bonding layer, a reference sign 5 denotes a Ti reaction layer, a reference sign 6 denotes a Ag-rich region, and a reference sign 7 denotes a Ag-poor region. The cross section illustrated in FIG. 2 is formed by the Z-axis direction corresponding to the thickness direction of the bonding layer 4 and an orthogonal direction thereto (for example, the Y-axis direction). In this cross section, the measurement region having a size of the thickness of the bonding layer 4×the length of 200 μm in the orthogonal direction orthogonal to the thickness direction (for example, Y-axis direction), and a triple continuous measurement region in which three measurement regions are continuously linked in the orthogonal direction (for example, the Y-axis direction) are set. When the ceramic substrate 2 is a silicon nitride substrate, the Ti reaction layer 5 is a titanium nitride (TiN) layer.

Besides, titanium nitride contained in the Ti reaction layer 5 is mainly one having an atomic ratio between Ti and N of 1:1. It is noted that titanium nitride having an atomic ratio of 1:1 between Ti and N. It is noted that titanium nitride having an atomic ratio other than 1:1 between Ti and N may also be present in the Ti reaction layer 5.

Alternatively, when the ceramic substrate 2 is an oxide-based ceramic substrate, the Ti reaction layer 5 is a titanium oxide ($TiO_2$) layer. The titanium oxide layer mainly contains titanium oxide having an atomic ratio between Ti and O of 1:2. It is noted that titanium oxide having an atomic ratio of 1:2 between Ti and O. It is noted that titanium oxide having an atomic ratio other than 1:2 between Ti and O may also be present in the Ti reaction layer 5.

First, the Ag-rich region 6 having a Ag concentration of 60 at % or more is present. Hereinafter, the Ag-rich region having a Ag concentration of 60 at % or more is sometimes simply referred to as the Ag-rich region. Owing to the presence of the Ag-rich region 6, the bonding strength can be improved. Besides, when the area ratio of the Ag-rich region in the measurement region is 70% or less, an etching property can be improved. The bonding layer is protruded from an end portion of the metal plate 3 in the same manner as described in Patent Document 1, and thus, the TCT characteristics of the bonded assembly is improved. The protruded portion is controlled to have an amount of protrusion in accordance with the thickness of the bonding layer 4. The protruded portion is formed by an etching treatment. The etching treatment is a treatment of dissolving an unnecessary portion with a chemical liquid. The chemical liquid for use in etching has a rate of dissolving Cu different from a rate of dissolving Ag. In general, Cu is easily etched, and Ag is an element difficult to be etched. Therefore, the Ag-rich region is a region difficult to be etched. When the area ratio of the Ag-rich region in the measurement region is 70% or less, an area ratio of the area difficult to be etched can be reduced. Thus, the shape of the protruded portion can be easily adjusted in the etching treatment. Accordingly, the area ratio of the Ag-rich region in the measurement region is preferably 70% or less, and more preferably 50% or less. The lower limit of the area ratio of the Ag-rich region in the measurement region is preferably 20% or more. This is because, when the Ag-rich region occupies less than 20% per unit area, the bonding strength can be reduced.

It is preferable that the Ag-rich region 6 is disposed on the Ti reaction layer 5, namely, is in contact with the Ti reaction layer 5. The etching treatment is performed from the side of the metal plate 3. This is because, when the Ag-rich region 6 is disposed on the side of the metal plate 3, the etching efficiency in the bonding layer 4 can be degraded. If there are a plurality of Ag-rich regions 6 in the measurement region, it is preferable that 80% or more and 100% or less of the total area of the Ag-rich regions 6 is present on the Ti reaction layer 5.

The triple continuous measurement region in which three measurement regions are continuously linked in the orthogonal direction orthogonal to the thickness direction is measured. When a Ag distribution is measured in the triple continuous measurement region, it is preferable that at least one region in which Ag-poor regions each having a Ag concentration of 50 at % or less are linked in the thickness direction of the bonding layer 4 is present. Here, the measurement region refers to the range having a size of the thickness of the bonding layer 4×the length of 200 μm in the orthogonal direction orthogonal to the thickness direction. To measure the triple continuous measurement region means that three ranges each having a size of the thickness of the bonding layer 4×the length of 200 μm in the orthogonal direction orthogonal to the thickness direction are measured. Hereinafter, the Ag-poor region 7 having a Ag concentration of 50 at % or less is sometimes simply referred to as the Ag-poor region 7.

The Ag concentration in the Ag-poor region 7 being 50% or less means that there are a large amount of elements in addition to Ag. The Ag concentration in the Ag-poor region is preferably 50 at % or less, and more preferably 40 at % or less. The Ag-poor region is more easily etched than the Ag-rich region. When at least one Ag-poor region is present in the triple continuous measurement region, the etching property of the bonding layer 4 can be improved. It can be determined by color mapping of EDX whether or not the Ag-poor region is present in the triple continuous measurement region. Besides, it is preferable that a region where the Ag-poor regions are linked in the thickness direction is present no matter which part of the triple continuous measurement region of the bonding layer 4 is measured.

It is noted that a region having a Ag concentration exceeding 50 at % and less than 60 at % is present in some cases. The region having a Ag concentration exceeding 50 at % and less than 60 at % is so-called a Ag intermediate region. The Ag intermediate region preferably has an area ratio in a range of 0% or more and 20% or less. When the area ratio of the Ag intermediate region exceeds 20%, the effect by the increase of the Ag-poor region may be insufficient. Therefore, the area ratio of the Ag intermediate region is preferably 0% or more and 20% or less, more preferably 0% or more and 10% or less, and most preferably 0%.

The bonding layer 4 has a thickness preferably in a range of 10 μm or more and 60 μm or less. The thickness of the bonding layer 4 refers to a length from the boundary between the ceramic substrate 2 and the bonding layer 4 to the boundary between the bonding layer 4 and the metal plate 3. When the thickness of the bonding layer 4 is 10 μm or more and 60 μm or less, the bonding strength and the etching property can be both favorable.

When the thickness of the bonding layer 4 is less than 10 μm, the bonding layer 4 is so thin that it can be difficult to control the area ratio of the Ag-rich region to be 70% or less. On the other hand, when the thickness of the bonding layer 4 exceeds 60 μm, an etching amount is increased, which can be a factor for increasing cost. Therefore, the thickness of the bonding layer 4 is preferably 10 μm or more and 60 μm or less, and more preferably 15 μm or more and 40 μm or less.

The boundary between the ceramic substrate 2 and the bonding layer 4 corresponds to the boundary between the ceramic substrate 2 and the Ti reaction layer 5. The boundary between the bonding layer 4 and the metal plate 3 is the farthest portion in the region continuous to the bonding layer 4 and having a Ag component of 5 at % or more as described above.

Besides, it is preferable that the bonding layer 4 contains Sn or In, and that the concentration of Sn or In in the measurement region is in a range of 1 at % or more and 6 at % or less. The measurement region here is the region formed in the cross section formed by the thickness direction of the bonding layer 4 and the orthogonal direction thereto, and refers to the rectangular (square or oblong) range having a size of the thickness of the bonding layer 4×the length of 200 μm in the orthogonal direction orthogonal to the thickness direction. When Sn (tin) or In (indium) is contained in the bonding layer 4, the melting point of the brazing material contained in the bonding layer 4 can be lowered. Besides, when Sn or In is contained, the Ag-rich region and the Ag-poor region can be easily formed. The bonding layer 4 contains Ag, Cu, and Ti. Ag and Cu are elements easily forming eutectic crystal. Ag—Cu eutectic crystal is stable at an atomic ratio Ag:Cu of approximately 7:3. Therefore, a bonding layer containing a large amount of the Ag-rich region is obtained. When Sn or In is contained, such an element forms a compound together with Ag or Cu, and hence the Ag-poor region is easily formed.

Besides, the concentration of Sn or In in the measurement region is preferably 1 at % or more and 6 at % or less. When the concentration of Sn or In is less than 1 at %, the effect obtained by containing the element can be insufficient. On the other hand, when the concentration of Sn or In is high beyond 6 at %, the amount of forming the Ag-rich region can be insufficient.

Besides, it is preferable that the concentration of Sn or In is in the range of 1 at % or more and 6 at % or less in the measurement region no matter which part of the bonding layer 4 is measured. This means that the distribution of Sn or In is not largely varied although the Ag-rich region and the Ag-poor region are formed. In other words, Sn or In plays a role in controlling the area ratio of the Ag-rich region.

The bonding layer 4 may contain C (carbon). Carbon has an effect of suppressing wet-spreading of a bonding brazing material.

Figure 3:
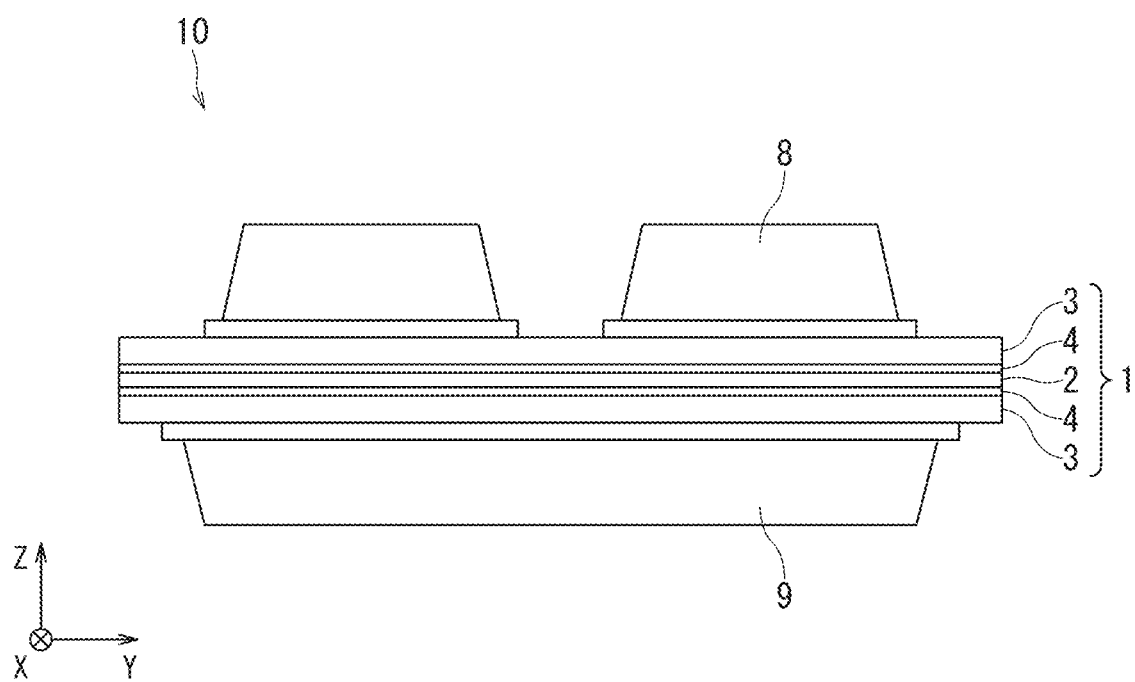
FIG. 3 is a side view illustrating an example of a ceramic-copper circuit substrate according to the embodiment.

The bonded assembly 1 described so far is suitable for a ceramic circuit substrate. FIG. 3 illustrates an example of a ceramic circuit substrate. In FIG. 3, a reference sign 10 denotes a ceramic circuit substrate, a reference sign 8 denotes a circuit unit, and a reference sign 9 denotes a heat sink. Also in FIG. 3, a reference sign 1 denotes a bonded assembly, a reference sign 2 denotes a ceramic substrate, a reference sign 3 denotes a metal plate, and a reference sign 4 denotes a bonding layer. In FIG. 3, a pattern shape is provided on the metal plate 3 on a front side (upper side in FIG. 3) of the bonded assembly 1 to form the circuit unit 8. Examples of a method for forming the circuit unit 8 include a method in which the metal plate is bonded with a brazing material, and a metallization method using a metal paste. In FIG. 3, the heat sink is bonded to the metal plate 3 on a rear side (lower side in FIG. 3) of the bonded assembly 1, and the circuit unit 8 may be bonded to both the front and rear surfaces. The number and the size of circuit units 8 can be changed if necessary.

On the ceramic circuit substrate 10, a pattern shape according to purposes needs to be formed. For forming the pattern, etching is effective. The bonded assembly 1 of the present embodiment is suitable for an etching process. Besides, the bonded assembly 1 is suitable for the ceramic circuit substrate 10 having a protruded portion of the bonding layer 4 protruded from an end portion of the metal plate 3. Besides, the side surface of the metal plate 3 may be inclined.

The bonding strength of the metal plate 3 can be 16 kN/mm or more. The bonding strength is measured by a peel test. As a sample of the peel test, a strip-shaped metal plate bonded to a ceramic substrate is used. The metal plate 3 is bonded preferably to have one end protruded from the ceramic substrate 2. The peel strength can be measured by vertically pulling the protruded portion of the metal plate 3.

When a protruded portion of the metal plate 3 is not formed, the end portion of the metal plate 3 itself is pulled. When a plurality of metal plates 3 are bonded, the peel test is performed using the metal plate 3 close to a creepage surface of the ceramic substrate 2.

Figure 4:
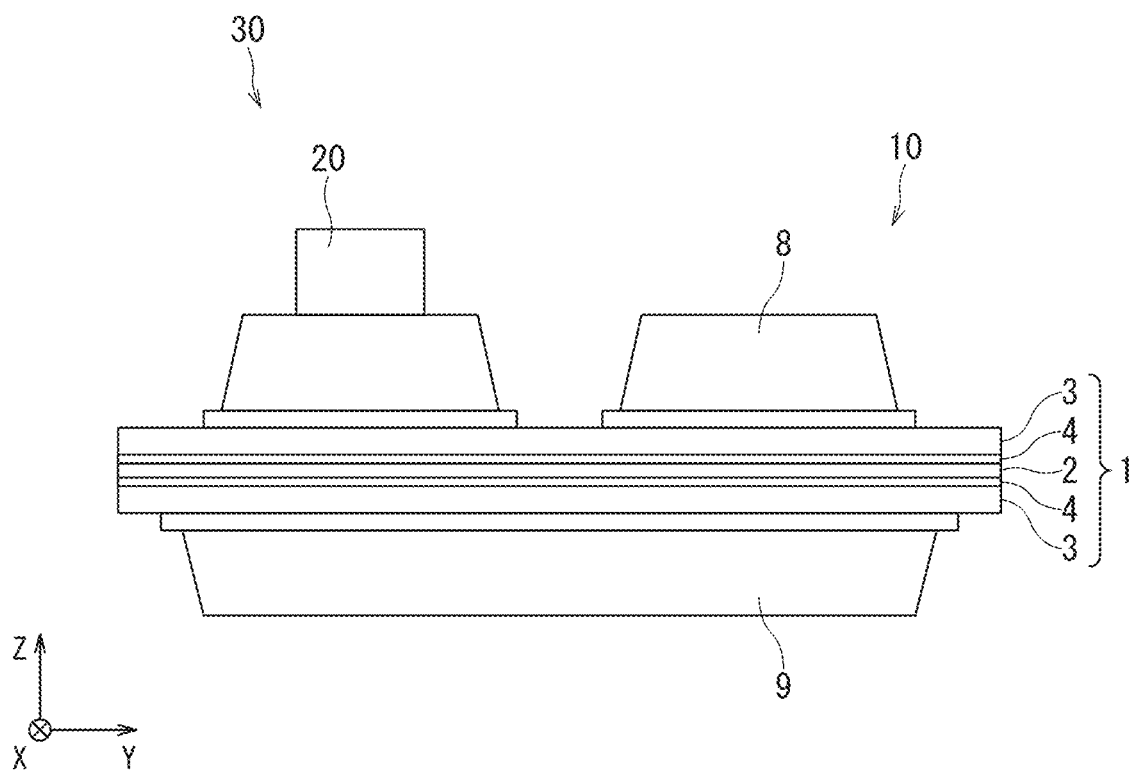
FIG. 4 is a side view illustrating an example of a semiconductor device according to the embodiment.

The ceramic circuit substrate 10 of the present embodiment can be applied to a semiconductor device on which a semiconductor element is mounted. FIG. 4 illustrates an example of a semiconductor device of the present embodiment. In FIG. 4, a reference sign 8 denotes a circuit unit, a reference sign 9 denotes a heat sink, a reference sign 10 denotes a ceramic circuit substrate, a reference sign 20 denotes a semiconductor element, and a reference sign 30 denotes the semiconductor device. The semiconductor element 20 is bonded onto a surface (upper side in FIG. 4) of the circuit unit 8 of the ceramic circuit substrate 10 through a bonding layer. Though FIG. 4 illustrates an example in which one semiconductor element 20 is mounted, a plurality of semiconductor elements 20 may be mounted. Besides, in addition to the semiconductor element 20, a lead frame, a metal terminal, a wire bonding and the like not shown may be bonded to the circuit unit 8.

Next, a method for producing the bonded assembly 1 of the present embodiment will be described. The bonded assembly 1 of the present embodiment is not limited to the production method as long as it has the above-described structure, and a production method for producing the bonded assembly at a high yield is as follows.

First, the ceramic substrate 2 is prepared. Examples of the ceramic substrate 2 include a silicon nitride substrate, an aluminum nitride substrate, an aluminum oxide substrate, and an alumina-zirconia substrate. The thickness of the ceramic substrate 2 is preferably 0.1 mm or more and 1 mm or less.

When the ceramic substrate 2 is a silicon nitride substrate, the ceramic substrate 2 preferably has three-point bending strength of 600 MPa or more. Besides, the ceramic substrate 2 preferably has thermal conductivity of 80 W/m·K or more. The thickness of the substrate can be reduced when the strength of the silicon nitride substrate is increased. Therefore, the three-point bending strength of the silicon nitride substrate is preferably 600 MPa or more, and more preferably 700 MPa or more. The thickness of the silicon nitride substrate can be reduced to 0.40 mm or less, and further to 0.30 mm or less. The length and width size of the ceramic substrate 2 may be that of a large-scale substrate for producing multiple ones. Alternatively, the length and width size of the ceramic substrate 2 may be a size used as the ceramic circuit substrate 10.

Next, the metal plate 3 is prepared. The metal plate 3 is preferably one selected from a copper plate, a copper alloy plate, an aluminum plate, and an aluminum alloy plate. The thickness of the metal plate 3 is preferably 0.3 mm or more, and more preferably 0.6 mm or more. The upper limit of the thickness of the metal plate 3 is not especially limited, and is preferably 2 mm or less. When the metal plate 3 is as thick as beyond 2 mm, an etching treatment can be difficult to perform. The length and width size of the metal plate 3 may be the same as that of the ceramic substrate 2. Besides, a metal plate having been precedently processed to have a pattern shape may be used.

Next, a bonding brazing material is prepared. The bonding brazing material contains, as essential components, Ag (silver), Cu (copper), and Ti (titanium). Besides, one, two or more selected from Sn (tin), In (indium), and C (carbon) may be added if necessary.

Ag and Cu are components working as a base of the bonding layer 4. Ti is a component for forming the Ti reaction layer 5 through a reaction with the ceramic substrate 2. As Ti, simple Ti or titanium hydride (TiH$_2$) may be used. Sn or In has an effect of lowering the melting point of the brazing material. C (carbon) can control the fluidity of the brazing material.

The content of Ag is preferably 20 mass % or more and 60 mass % or less, and the content of Cu is preferably 15 mass % or more and 40 mass % or less. The content of one or both of Ti and TiH$_2$ is preferably in a range of 1 mass % or more and 15 mass % or less. The content of one or both of Sn (tin) or In (indium) is preferably in a range of 1 mass % or more and 50 mass % or less. The content of C (carbon) is preferably in a range of 0.01 mass % or more and 2 mass % or less.

Composition ratios of the brazing material are calculated assuming that the total ratio of raw materials to be mixed is 100 mass %. For example, when three raw materials of Ag, Cu, and Ti are contained, Ag+Cu+Ti=100 mass %. Alternatively, when four raw materials of Ag, Cu, TiH$_2$, and In are contained, Ag+Cu+TiH$_2$+In=100 mass %. When five raw materials of Ag, Cu, Ti, Sn, and C are contained, Ag+Cu+Ti+Sn+C=100 mass %.

Besides, particle sizes of raw material powders of the brazing material are preferably as follows.

A Ag powder has an average particle size $D_{50}$ of preferably 3.0 μm or less. A Cu powder has an average particle size $D_{50}$ of preferably 12.0 μm or less, and more preferably 10.0 μm or less. A Ti powder or TiH$_2$ power has an average particle size $D_{50}$ of preferably 6.0 μm or less. A Sn powder or an In powder has an average particle size $D_{50}$ of preferably 16.0 μm or less, and more preferably 14.0 μm or less. A carbon powder has an average particle size $D_{50}$ of preferably 3.0 μm or less.

Besides, a particle size $D_{50}$ of Ag is preferably 1.5 μm or more and 3.0 μm or less, and more preferably 1.8 μm or more and 2.8 μm or less.

Furthermore, a particle size $D_{10}$ of the Ag powder is preferably 1.0 μm or more. A particle size $D_{90}$ of the Ag powder is preferably 3.5 μm or less. It is preferable that with the average particle size $D_{50}$ of the Ag powder set to 3.0 μm or less, the particle size $D_{10}$ is 1.0 μm or more and the particle size $D_{90}$ is 3.5 μm or less. By thus controlling the particle sizes $D_{10}$, $D_{50}$, and $D_{90}$, a Ag powder having a uniform particle size is obtained. The Ag powder having a uniform particle size is a powder having a sharp particle size distribution. Thus, the Ag powder is easily agglomerated, and the Ag-rich region is easily formed.

The Ag powder has a tap density of preferably 4.5 g/cm$^3$ or more. A tap density is a value obtained by dividing the mass of a powder sample by a tap volume thereof. A tap volume is obtained by measuring interparticle voids formed after lifting up a container filled with the powder sample to a prescribed height, and then dropping it. The tap density is measured in accordance with JIS-Z-2512 (2012). It is noted that JIS-Z-2512 corresponds to ISO3953 (2011).

A tap density corresponds to fluidity of a powder. A powder having a high tap density has good fluidity. When the fluidity is improved, the Ag powder can be applied with the agglomerated state retained. As a result, the Ag-rich region 6 can be easily formed. Therefore, the tap density of the Ag powder is preferably 4.5 g/cm$^3$ or more, and more preferably 4.8 g/cm$^3$ or more. The upper limit of the tap density of the Ag powder is not especially limited, and is preferably 6.2 g/cm$^3$ or less. A tap density as high as beyond 6.2 g/cm$^3$ can be a factor for increasing cost.

Besides, in the Ag powder, a total content of Na (sodium), K (potassium), and Cl (chloride) is preferably 0.005 mass % or less. Besides, a content of each of these elements is preferably 0.002 mass % or less. Na, K, and Cl are impurities. When the amount of these elements is large, reactivity in heat bonding process can be deteriorated.

When the above-described structure is employed, the Ag-rich region 6 can be easily formed in the bonding layer 4.

The component powders of the brazing material are mixed to prepare a mixed powder in which the components are homogeneously dispersed. The process for mixing the component powders is performed preferably for 10 hours or more.

Next, the mixed powder is mixed with a binder and a solvent to prepare a brazing material paste. The process for mixing the mixed powder with the binder and the like is also performed preferably for 10 hours or more.

The brazing material paste is applied to at least one of the ceramic substrate and the metal plate. The thus formed brazing material paste layer has a thickness of preferably 5 μm or more and 60 μm or less. The thickness of the brazing material paste layer refers to a thickness obtained after drying the applied paste. When the thickness is less than 5 μm, the bonding strength can be reduced. When the thickness is as large as beyond 60 μm, the bonding layer 4 is so thick that etching load can be increased. Therefore, the thickness of the brazing material paste layer is preferably 5 µm or more and 60 µm or less, and more preferably 10 µm or more and 50 µm or less.

After the process of applying the brazing material paste, one of the ceramic substrate and the metal plate on which the paste has not been applied is placed on the other. For example, when the brazing material paste is applied to the ceramic substrate, the metal plate is placed thereon in this process. Alternatively, when the brazing material paste is applied to the both surfaces of the ceramic substrate, the metal plates may be disposed on the both surfaces. Alternatively, the brazing material paste may be applied to the metal plate to have the ceramic substrate be placed thereon.

Next, the heat bonding process is performed. A heating temperature is preferably 720 degrees Celsius or more and 920 degrees Celsius or less. The heat bonding process is performed preferably in an atmosphere of vacuum of $10^{-3}$ Pa or less.

Through the above-described processes, the bonded assembly 1 can be produced. Besides, the ceramic circuit substrate 10 can be produced by performing an etching treatment on the bonded assembly 1. For the etching treatment, any method can be applied. An example of the etching treatment includes one described in International Publication No. WO2019/054294 (Patent Document 3). For the etching treatment of the bonded assembly 1 produced by the active metal bonding method, it is necessary to perform an etching process on the metal plate 3, an etching process on the bonding layer 4, and an etching process on the Ti reaction layer 5. In the bonded assembly 1 of the present embodiment, the distribution of the Ag-rich region 6 is controlled, and hence, a process speed in the etching process of the bonding layer 4 can be increased. Besides, an etching rate in the etching treatment of the bonding layer 4 can be stabilized. As a result, variation in the size of the protruded portion of the bonding layer 4 can be reduced. The ceramic circuit substrate 10 of the present embodiment can be improved in the bonding strength of the metal plate 3 as described above. In other words, with the bonding strength retained, the etching property can be improved.

After the etching treatment, the resultant is subjected to a scribing process if necessary to produce multiple devices.

EXAMPLES

Examples 1 to 10, and Comparative Example 1

A silicon nitride substrate, an aluminum nitride substrate, and an alumina-zirconia substrate were prepared as the ceramic substrate. The silicon nitride substrate had a size of 200 mm in length×160 mm in width×0.32 mm in thickness, and thermal conductivity of 90 W/m·K. The aluminum nitride substrate had a size of 200 mm in length×160 mm in width×0.635 mm in thickness, and thermal conductivity of 170 W/m·K. The alumina-zirconia substrate had a size of 200 mm in length×160 mm in width×0.635 mm in thickness, and thermal conductivity of 20 W/m·K.

As the metal plate, a copper plate was prepared. A first copper plate had a size of 200 mm in length×160 mm in width×0.8 mm in thickness. A second copper plate had a size of 200 mm in length×160 mm in width×0.3 mm in thickness.

Next, brazing materials were prepared. The compositions of the brazing materials are shown in Table 1. Particle sizes of components of the brazing materials are shown in Tables 2 and 3.

TABLE 1

| | Compositions of Brazing Materials [wt %] |
|---|---|
| Brazing Material 1 | Ag(60)—Cu(25)—Sn(10)—Ti(5) |
| Brazing Material 2 | Ag(49.8)—Cu(29)—Sn(13)—TiH$_2$(8)—C(0.2) |
| Brazing Material 3 | Ag(47.7)—Cu(30)—Sn(15)—TiH$_2$(7)—C(0.3) |
| Brazing Material 4 | Ag(64)—Cu(25)—Sn(8)—Ti(3) |
| Brazing Material 5 | Ag(46.9)—Cu(33)—Sn(11)—TiH$_2$(9)—C(0.1) |

TABLE 2

| | Average Particle Size $D_{50}$ [µm] | | | | |
|---|---|---|---|---|---|
| | Ag | Cu | Sn | Ti or TiH$_2$ | C |
| Brazing Material 1 | 1.8 | 7.8 | 12.8 | 3.2 | — |
| Brazing Material 2 | 2.3 | 8.2 | 10.2 | 2.8 | 1.2 |
| Brazing Material 3 | 2.8 | 10.1 | 9.8 | 2.5 | 1.0 |
| Brazing Material 4 | 3.3 | 8.2 | 9.8 | 2.7 | — |
| Brazing Material 5 | 2.2 | 8.4 | 13.3 | 2.7 | 1.0 |

TABLE 3

| | Ag Powder | | | | |
|---|---|---|---|---|---|
| | $D_{10}$ [µm] | $D_{50}$ [µm] | $D_{90}$ [µm] | Tap Density [g/cm$^3$] | Total Amount of Na, K and Cl |
| Brazing Material 1 | 1.1 | 1.8 | 3.3 | 5.2 | <0.005 |
| Brazing Material 2 | 1.2 | 2.1 | 2.9 | 5.7 | <0.005 |
| Brazing Material 3 | 1.5 | 2.5 | 3.1 | 5.0 | <0.005 |
| Brazing Material 4 | 0.7 | 3.3 | 3.7 | 4.2 | <0.005 |
| Brazing Material 5 | 1.6 | 2.2 | 3.1 | 5.5 | <0.005 |

The brazing materials 1 to 3 and 5 had the particle sizes $D_{10}$, $D_{50}$, and $D_{90}$, and the tap density of the Ag powders controlled to fall in the preferable ranges as shown in Table 3. The brazing material 4 had a tap density less than 4.5 g/cm$^3$ as shown in Table 3. The tap density was measured in accordance with JIS-Z-2512 (2012).

Next, a mixing process for mixing the component powders of each brazing material were performed for 10 hours or more. Thereafter, the mixed powder resultant was mixed with a binder and a solvent to prepare a brazing material paste. The process for mixing the mixed powder with the binder and the like was also performed for 10 hours or more.

Next, the brazing material paste was applied to both surfaces of the ceramic substrate, and the metal plates were disposed thereon. The heat bonding process was performed in a temperature range of 780 degrees Celsius or more and 850 degrees Celsius or less in vacuum of $10^{-3}$ Pa or less. Combinations of the ceramic substrate, the metal plate, and the brazing material are shown in Table 4. Through these processes, bonded assemblies of examples and comparative example were produced.

TABLE 4

|  | Ceramic Substrate | Metal Plate | Brazing Material |
|---|---|---|---|
| Example 1 | Silicon Nitride Substrate | Copper Plate 1 | Brazing Material 1 |
| Example 2 | Silicon Nitride Substrate | Copper Plate 1 | Brazing Material 1 |
| Example 3 | Silicon Nitride Substrate | Copper Plate 1 | Brazing Material 2 |
| Example 4 | Silicon Nitride Substrate | Copper Plate 1 | Brazing Material 2 |
| Example 5 | Silicon Nitride Substrate | Copper Plate 1 | Brazing Material 3 |
| Example 6 | Silicon Nitride Substrate | Copper Plate 2 | Brazing Material 3 |
| Example 7 | Aluminum Nitride Substrate | Copper Plate 2 | Brazing Material 1 |
| Example 8 | Silicon Nitride Substrate | Copper Plate 1 | Brazing Material 5 |
| Example 9 | Silicon Nitride Substrate | Copper Plate 1 | Brazing Material 5 |
| Example 10 | Alumina-Zirconia Substrate | Copper Plate 2 | Brazing Material 1 |
| Comparative Example 1 | Silicon Nitride Substrate | Copper Plate 1 | Brazing Material 4 |

In each of the thus obtained bonded assemblies of Examples 1 to 10 and Comparative Example 1 shown in Table 4, the thickness of the bonding layer and the bonding strength of the metal plate were measured. The thickness of the bonding layer was observed in a cross section formed by any thickness direction and an orthogonal direction thereto. The bonding strength of the metal plate was measured by the peel test. Results thus obtained are shown in Table 5.

The thickness of the bonding layer was measured by the above-described method. For the peel test, a peel test sample was prepared by employing bonding conditions of each of the examples and comparative example. As each sample, a strip-shaped copper plate was bonded to a ceramic substrate. At this point, the copper plate was bonded to have one end protruded from the ceramic substrate. This protruded portion of the copper plate was vertically pulled to measure the peel strength.

TABLE 5

|  | Thickness of Bonding Layer [μm] | Bonding Strength [kN/mm] |
|---|---|---|
| Example 1 | 18 | 19 |
| Example 2 | 25 | 21 |
| Example 3 | 20 | 23 |
| Example 4 | 32 | 24 |
| Example 5 | 23 | 24 |
| Example 6 | 28 | 25 |
| Example 7 | 31 | 18 |
| Example 8 | 35 | 30 |
| Example 9 | 40 | 33 |
| Example 10 | 30 | 22 |
| Comparative Example 1 | 18 | 18 |

As is understood from Table 5, the thickness of the bonding layer was in the range of 10 μm or more and 60 μm or less in Examples 1 to 10 and Comparative Example 1. In Examples 1 to 9, a titanium nitride layer was formed as the Ti reaction layer. In Example 10, a titanium oxide layer was formed as the Ti reaction layer.

Next, in each of Examples 1 to 10 and Comparative Example 1, a Ag-rich region and a Ag-poor region were measured by EDX analysis in a measurement region having a size of the thickness of the bonding layer×the length of 200 μm in the orthogonal direction to orthogonal the thickness direction, and an area ratio of the Ag-rich region was calculated. In Comparative Example 1, the area ratio of the Ag-rich region in the measurement region (the thickness of 18 μm×the length of 200μ in the orthogonal direction) was the largest (85%). In Comparative Example 1, the Ag concentration was the highest (48 at %) in the Ag-poor region in the measurement region. Besides, in Examples 1 to 10 and Comparative Example 1, it was checked whether or not one or more regions in which the Ag-poor regions were linked in the thickness direction were present in the triple continuous measurement region. Results thus obtained are shown in Table 6.

TABLE 6

|  | Area Ratio of Ag-rich region [%] | Ag Concentration in Ag-poor region [at %] | Presence or Absence of Region in which Ag-poor Region were Linked in Thickness Direction |
|---|---|---|---|
| Example 1 | 62 | 40 | Presence |
| Example 2 | 48 | 31 | Presence |
| Example 3 | 43 | 28 | Presence |
| Example 4 | 37 | 26 | Presence |
| Example 5 | 25 | 25 | Presence |
| Example 6 | 24 | 22 | Presence |
| Example 7 | 36 | 24 | Presence |
| Example 8 | 32 | 26 | Presence |
| Example 9 | 34 | 24 | Presence |
| Example 10 | 58 | 38 | Presence |
| Comparative Example 1 | 85 | 48 | Absence |

As is understood from Table 6, in the bonded assemblies of Examples 1 to 10, the area ratio of the Ag-rich region in the measurement region was 70% or less. In the bonded assemblies of Examples 1 to 10, all of the minimum value of the area ratio of the Ag-rich region was 20% or more even it was the smallest value in the measurement region. In the bonded assemblies of Examples 1 to 10, 80% or more of the Ag-rich region was formed on the titanium nitride layer.

Besides, in the bonded assemblies of Examples 1 to 10, the Ag concentration in the Ag-poor region was 50 at % or less even at the largest value. It was confirmed, in the bonded assemblies of Examples 1 to 10, that a region where the Ag-poor regions were linked in the thickness direction was present in the triple continuous measurement region.

On the contrary, in Comparative Example 1, the area ratio of the Ag-rich region in the measurement region was 85%. In Comparative Example 1, the region where the Ag-poor regions were linked in the thickness direction was not found in the triple continuous measurement region.

Next, the etching property of each bonded assembly was checked. As the etching treatment, etching treatment was first performed for forming a pattern shape on the copper plate. A portion having pattern spacing of 2 mm was formed in a plurality of positions. Through this process, the bonding layer was exposed in the bonded assembly.

Next, a process for etching the bonding layer and the titanium nitride layer was performed. For etching the bonding layer and the titanium nitride layer, an etching solution containing a hydrogen peroxide solution ($H_2O_2$) and ammonium fluoride ($NH_4F$) was prepared. Assuming that an etching time required for revealing the surface of the ceramic substrate in the bonded assembly of Comparative Example 1 was 100, a ratio in the etching time required for revealing the surface of the ceramic substrate in the bonded assembly of each example was obtained. Results thus obtained are shown in Table 7.

TABLE 7

|  | Ratio in Etching Time |
|---|---|
| Example 1 | 83 |
| Example 2 | 86 |
| Example 3 | 75 |
| Example 4 | 77 |
| Example 5 | 74 |
| Example 6 | 73 |
| Example 7 | 75 |
| Example 8 | 78 |
| Example 9 | 77 |
| Example 10 | 86 |
| Comparative Example 1 | 100 |

As is understood from Table 7, in the bonded assemblies of Examples 1 to 10, the etching time could be reduced by about 20 to 30% as compared with Comparative Example 1 when the etching conditions were the same. In other words, it is understood that the etching speed was low in Comparative Example 1 containing a large amount of the Ag-rich region.

Besides, an etching treatment for forming the protruded portion of the bonding layer protruded from the end portion of the metal plate was performed. A target amount of protrusion was set. The amount of protrusion resulting from the etching was measured in any 10 positions. The minimum value and the maximum value of the amount of protrusion were found. Results thus obtained are shown in Table 8.

TABLE 8

|  | Target Amount of Protrusion [μm] | Amount of Protrusion Resulting from Etching [μm] | | |
|---|---|---|---|---|
|  |  | Minimum Value | Maximum Value | Difference |
| Example 1 | 60 | 48 | 71 | ±23 |
| Example 2 | 50 | 37 | 58 | ±21 |
| Example 3 | 90 | 82 | 96 | ±14 |
| Example 4 | 40 | 35 | 48 | ±13 |
| Example 5 | 100 | 88 | 113 | ±25 |
| Example 6 | 30 | 25 | 38 | ±13 |
| Example 7 | 90 | 80 | 96 | ±16 |
| Example 8 | 70 | 58 | 81 | ±23 |
| Example 9 | 50 | 39 | 67 | ±28 |
| Example 10 | 90 | 81 | 105 | ±24 |
| Comparative Example 1 | 90 | 63 | 112 | ±49 |

As is understood from Table 8, in the bonded assemblies of Examples 1 to 10, a difference of the minimum value and the maximum value (the maximum value–the minimum value, or the minimum value–the maximum value) from the target amount of protrusion was within ±28 μm. On the contrary, a portion having a difference of 30 μm or more was formed in Comparative Example 1. It is thus understood that the shape could be retained through the etching treatment in the bonded assemblies of Examples 1 to 10. Therefore, it is understood that the bonded assembly 1 of the present embodiment is suitable for a product subjected to an etching treatment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A bonded assembly, comprising a metal plate and a ceramic substrate bonded to each other through a bonding layer containing Ag, wherein
   the bonding layer contains Sn or In, and a concentration of Sn or In in a measurement region is in a range of 1 at % or more and 6 at % or less,
   the measurement region that is formed in a cross section formed by a thickness direction of the bonding layer and an orthogonal direction thereto, and that has a size of a length in the thickness direction of the bonding layer×a length of 200 μm in the orthogonal direction, comprises a Ag-rich region having a Ag concentration of 60 at % or more that has an area of 70% or less of the area of the measurement region, and Ag-poor regions each having a Ag concentration of 50 at % or less, and
   at least one region where the Ag-poor regions are linked to each other in the thickness direction of the bonding layer is present in a triple continuous measurement region where three measurement regions are continuously linked to each other in the orthogonal region.

2. The bonded assembly according to claim 1, wherein the length in the thickness direction of the bonding layer is in a range of 10 μm or more and 60 μm or less.

3. The bonded assembly according to claim 1, wherein the ceramic substrate is a silicon nitride substrate, and the metal plate is a copper plate.

4. The bonded assembly according to claim 1, wherein the ceramic substrate is a silicon nitride substrate having a thickness of 0.4 mm or less, and the metal plate is a copper plate having a thickness of 0.5 mm or more.

5. A ceramic circuit substrate, comprising the bonded assembly according to claim 1.

6. A semiconductor device, comprising a semiconductor element mounted on the ceramic circuit substrate according to claim 5.

7. The bonded assembly according to claim 2, wherein the ceramic substrate is a silicon nitride substrate, and the metal plate is a copper plate.

8. The bonded assembly according to claim 7, wherein the ceramic substrate is a silicon nitride substrate having a thickness of 0.4 mm or less, and the metal plate is a copper plate having a thickness of 0.5 mm or more.

9. A ceramic circuit substrate, comprising the bonded assembly according to claim 8.

10. A semiconductor device, comprising a semiconductor element mounted on the ceramic circuit substrate according to claim 9.

* * * * *